US009064824B2

United States Patent
Hook et al.

(10) Patent No.: US 9,064,824 B2
(45) Date of Patent: Jun. 23, 2015

(54) IN-SITU ANNEALING FOR EXTENDING THE LIFETIME OF CMOS PRODUCTS

(71) Applicant: International Business Machines Corporation, Armonk, NY (US)

(72) Inventors: Terence B. Hook, Jericho, VT (US); Melanie J. Sherony, Wappingers Falls, NY (US); Christopher M. Schnabel, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/077,618

(22) Filed: Nov. 12, 2013

(65) Prior Publication Data
US 2015/0129898 A1      May 14, 2015

(51) Int. Cl.
*H01L 21/324* (2006.01)
*H01L 25/00* (2006.01)
*H01L 25/18* (2006.01)
*H01L 27/092* (2006.01)

(52) U.S. Cl.
CPC .............. *H01L 21/324* (2013.01); *H01L 25/50* (2013.01); *H01L 25/18* (2013.01); *H01L 27/092* (2013.01)

(58) Field of Classification Search
CPC .... H01L 21/6734; H01L 21/67; H01L 23/345
USPC ........ 257/84, 98; 438/106, 22, 25, 26, 48, 55, 438/64, 65, 110
See application file for complete search history.

(56) References Cited

U.S. PATENT DOCUMENTS

| | | | |
|---|---|---|---|
| 4,899,180 A | 2/1990 | Elhatem et al. | |
| 7,064,414 B2* | 6/2006 | Aitken et al. | 257/537 |
| 7,704,847 B2 | 4/2010 | Cannon et al. | |
| 8,178,365 B2 | 5/2012 | Narazaki et al. | |
| 8,249,737 B2 | 8/2012 | Ju et al. | |
| 8,344,411 B2* | 1/2013 | Chou et al. | 257/99 |
| 8,344,475 B2 | 1/2013 | Shaeffer et al. | |
| 2007/0158781 A1* | 7/2007 | Khan et al. | 257/529 |
| 2010/0230807 A1* | 9/2010 | Bronner et al. | 257/734 |
| 2012/0268217 A1 | 10/2012 | Saether | |
| 2013/0148437 A1 | 6/2013 | Bronner et al. | |

FOREIGN PATENT DOCUMENTS

JP    S60158634 U    8/1985

* cited by examiner

*Primary Examiner* — Kyoung Lee
*Assistant Examiner* — Mikka Liu
(74) *Attorney, Agent, or Firm* — Wood, Herron & Evans, LLP; Anthony J. Canale

(57) ABSTRACT

Methods for packaging a functional chip, methods for annealing a functional chip, and chip assemblies. A functional chip and an annealing chip are located inside a package. The functional chip includes an integrated circuit. The annealing chip includes an annealing element source comprised of an annealing element or a light source configured to emit electromagnetic radiation. The integrated circuit of the functional chip receives the annealing element, electromagnetic radiation, or both from the annealing chip in order to perform an annealing procedure that extends the useful lifetime of the packaged integrated circuit.

19 Claims, 4 Drawing Sheets

IN-SITU ANNEALING FOR EXTENDING THE LIFETIME OF CMOS PRODUCTS

BACKGROUND

The invention relates generally to integrated circuits and, in particular, to methods and assemblies for extending the useful lifetime of a packaged integrated circuit, such as a packaged CMOS product.

The operating requirements of integrated circuits apply stress on the devices, which may lead over time to performance and reliability problems. The useful lifetime of integrated circuits based on complementary metal oxide semiconductor (CMOS) transistors may be determined by the useful lifetime of the CMOS transistors themselves. In particular, CMOS transistors may experience shifts in electrical parameters and adverse changes in performance.

Interface degradation during operation may reduce the useful lifetime of CMOS transistors. Interface degradation may originate from an increase in trap density at device interfaces caused by voltage stress over time. Because charge carriers can become trapped in the gate dielectric of a CMOS transistor, the switching characteristics of the transistor can be permanently changed. The presence of mobile charge carriers in the gate dielectric triggers numerous physical damage processes that can drastically change the device characteristics over prolonged periods. The accumulated damage from the interaction of the mobile charge carriers with the gate dielectric can eventually cause the integrated circuit to fail as electrical parameters, such as threshold voltage, shift from their initial state due to damage accumulation.

Methods and assemblies for counteracting or reversing shifts in electrical parameters and performance degradation are needed.

SUMMARY

In an embodiment of the invention, a method is provided for packaging a functional chip. The method includes forming, on an annealing chip, an annealing element source comprised of an annealing element or a light source configured to emit electromagnetic radiation. The method further includes placing the annealing chip and the functional chip inside of a package to form an assembly.

In an embodiment of the invention, a method is provided for annealing a functional chip. The method includes delivering, to an integrated circuit of the functional chip, an annealing element or electromagnetic radiation from an annealing chip assembled inside a package with the functional chip.

In an embodiment of the invention, an assembly includes a package, a functional chip inside the package, and an annealing chip inside the package. The functional chip includes an integrated circuit. The annealing chip includes an annealing element source comprised of an annealing element or a light source configured to emit electromagnetic radiation.

BRIEF DESCRIPTION OF THE SEVERAL VIEWS OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
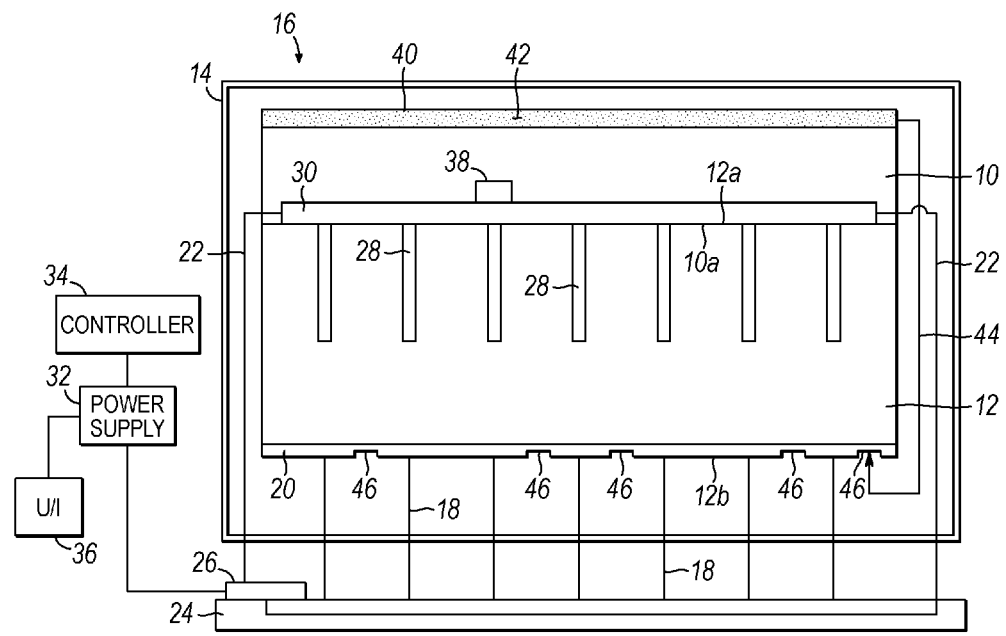
FIG. 1 is a diagrammatic view of annealing and functional chips inside a product package in accordance with an embodiment of the invention.
Figure 1A:
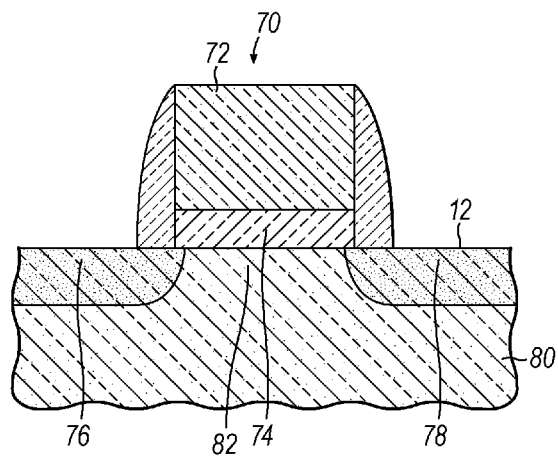
FIG. 1A is a cross-sectional view of a device of an integrated circuit of the functional chip in FIG. 1.

With reference to FIGS. 1, 1A and in accordance with an embodiment of the invention, an annealing chip 10 and a functional chip 12 are located inside of a package 14 to define an assembly, generally indicated by reference numeral 16. The package 14 may be a hermetic package that is impervious to the external environment, such as moisture in the external environment. As a result, the annealing chip 10 and functional chip 12 are sealed inside of the package 14. Leads 18 extend from the functional chip 12 through the package 14 and are used to connect an integrated circuit 20 at the frontside 12b of the functional chip 12 with other electronic devices in the external environment. The leads 18 may comprise wires applied by a wirebonding process or a different type of electrical connection, such as solder bumps applied by a flip chip bonding process. Lines 22 extend from the annealing chip 10 to the external environment of the package 14. In a representative embodiment, the package 14 may be located on a substrate 24, such as a printed circuit board, that includes additional circuitry 26 that is coupled by lines 22 with the annealing chip 10 and the leads 18 may couple the functional chip 12 with bond pads on the substrate 24.

The package 14 and its functional chip 12 may be integrated with other chips, discrete circuit elements, and/or other signal processing devices as part of either (a) an intermediate product, such as a motherboard, or (b) an end product. The end product can be any end product that includes integrated circuit chips, ranging from toys and other low-end applications to advanced computer products having a display, a keyboard or other input device, and a central processor.

The leads 18 extending from the functional chip 12 are coupled with structures, such as bond pads, on the same face of the functional chip 12 as the integrated circuit 20. The annealing chip 10 and functional chip 12 may be thermally coupled together by a set of thermal conductors 28. The integrated circuit 20 of the functional chip 12 is located on an opposite face of the functional chip 12 from the location of the thermal conductors 28.

In one embodiment, the thermal conductors 28 may comprise through silicon vias (TSVs) that are formed by three-dimensional chip bonding techniques as metallic elements in the functional chip 12. In an alternative embodiment, the thermal conductors 28 may comprise through silicon vias that are formed as metallic elements in the annealing chip 10. The thermal conductors 28 function as thermal conduction paths through the annealing chip 10 or the functional chip 12. Generally, thermal conductors 28 in the form of TSVs may be fabricated by deep reactive ion etching or laser drilling deep vias into the material of the wafer used to form the annealing chip 10 or the functional chip 12, optionally electrically insulating the deep vias, lining each via with a conductive liner, and filling each via with a metal (e.g., copper, tungsten), then thinning the chip from the back side until the via metals are exposed and optionally depositing a metal film to form a back-side-metal.

The annealing chip 10 includes at least one heater 30 that, when energized, is configured to generate thermal energy in the form of heat. The heater 30 may include a resistor that releases heat when an electrical current is supplied to it. Alternatively, instead of a single resistor, the heater 30 may comprise multiple resistors that may be arranged in a mesh. In the representative embodiment, the heater 30 is located proximate to the frontside 10a of the annealing chip 10.

Heat energy from the heater 30 may be transferred by thermal conduction using the thermal conductors 28 from the annealing chip 10 to the functional chip 12 and absorbed by the functional chip 12. In the representative embodiment, the heat energy is conducted by the thermal conductors 28 from the backside 12a of the functional chip 12 through the functional chip 12 to the proximity of the integrated circuit 20 on the frontside 12b of the functional chip 12. The heat energy elevates the temperature of the devices of the integrated circuit 20. As a result, the annealing chip 10 is configured to anneal the devices of the integrated circuit 20 of functional chip 12.

The functional chip 12 and its devices may be heated to a sequence of targeted temperatures in a temperature profile, such as by ramping over a time period, stepping with each temperature held for a portion of the time period, or a combination thereof. The heater 30 and/or the thermal conductors 28 may be sized and arranged such that heat is distributed across the entire functional chip 12. Alternatively, the heater 30 and/or the thermal conductors 28 may be sized and arranged such that heat is distributed to only a portion of the functional chip 12 so that only the chip portion is heated to the targeted temperature.

The heater 30 is coupled with a power supply 32 that may be included in the additional circuitry 26 located on the substrate 24 or that may be a separate standalone component. The power supply 32 is configured to deliver electrical power to the heater 30 in response to instructions or programmed settings received from a controller 34, user interaction at a user interface 36, instructions or programmed settings received from the circuitry 26 or the integrated circuit 20 of the functional chip 12, and/or other instructions or input received at the power supply 32. Among the parameters for the operation of the power supply 32 that may be selected with instructions or programmed settings include, but are not limited to, anneal temperature and/or operating current, anneal duration, and anneal frequency.

In one embodiment, the heater 30 may comprise a thin film resistor that includes a body comprised of a refractory metal, such tantalum nitride (TaN), titanium nitride (TiN), and multi-layered combinations of these and other materials. The refractory metal constituting the thin film resistor may be deposited with a sputtering technique and shaped by photolithography and etching. The resistance value of the thin film resistor is determined by selection of, among other variables, the composition, the thickness, and the planar geometry of the deposited and shaped refractory metal.

The power supply 32 may supply an electrical current to the heater 30 at an amperage predicted, calculated, or empirically determined to produce a targeted anneal temperature at the functional chip 12. The electrical current is supplied over a duration adequate to impart a desired annealing effect to the devices of the functional chip 12. The duration of an annealing procedure may be fixed in length (e.g., annealing temperature applied for a predetermined time in response to a command to execute an annealing procedure), controlled by explicit start-anneal and stop-anneal commands, or programmed into a control register within the annealing circuitry. The heater 30 is not activated to generate heat unless power is supplied from the power supply 32. Unless and until an annealing procedure is conducted, the heater 30 is normally unpowered and quiescent.

A temperature sensor 38 may be included on the annealing chip 10 or, alternatively, on the functional chip 12. The temperature sensor 38 may be configured to provide temperature readings for use in feedback control of the heating by the power supply 32. For example, the temperature readings may be supplied to the circuitry 26 on the substrate 24 if circuitry 26 is providing the control logic for the annealing procedure and executing the associated control algorithm to operate the power supply 32. In an alternative embodiment, multiple temperature sensors like sensor 38 may be included on either the annealing chip 10 or the functional chip 12, and used to provide feedback control over the heating by the power supply 32.

The annealing chip 10 also includes an annealing element source 40 configured to store an amount of an annealing element 42, preferably without significant loss, for an extended period and to leak or release the annealing element during an annealing procedure into the interior of the package 14. The annealing element 42 cooperates with the heat transferred from the annealing chip 10 to the functional chip 12 to anneal the devices of the functional chip 12. In one embodiment, the annealing element source 40 may comprise a material infused with the annealing element 42 and that, upon heating by the heater 30, is configured to release the annealing element into the interior space of the package 14. While the heater 30 and the annealing element source 40 are depicted as separate components of the annealing chip 10, the heater 30 and annealing element source 40 may be combined into a unitary or integral component of the annealing chip 10.

In one embodiment, the annealing element source 40 may comprise a layer of silicon nitride that is formed by plasma-enhanced chemical vapor deposition (PECVD) with the annealing element 42 present as a reactant during layer formation so that the annealing element 42 is incorporated into the silicon nitride during deposition. The annealing element 42 may comprise hydrogen or a different species containing an element capable of passivating traps present in the devices of the integrated circuit 20. If the annealing element 42 is hydrogen, then the annealing element source 40 may comprise a layer of hydrogenated silicon nitride ($SiN_xH_y$) that releases hydrogen when heated above a threshold temperature.

The interior space of the package 14 also includes a pathway, diagrammatically indicated by reference numeral 44, that permits the annealing element 42 that is released from the annealing element source 40 to migrate or diffuse within the package 14 and reach the vicinity of the integrated circuit 20 of the functional chip 12. In one embodiment, the package 14 may comprise a housing or shell that surrounds the chips 10, 12 such that the pathway 44 is comprised of the entire open interior space inside the package 14. The open interior space of the package 14 may be evacuated so that a partial vacuum is present. Alternatively, the package 14 may be a molded construct in which the interior space is filled by a material, such as a cured polymer, that is configured to provide the pathway 44. The package 14 should be configured to confine the released annealing element 42 within the interior space and to minimize or prohibit its escape from the interior space to the exterior environment.

The functional chip 12 may also include diffusion pathways 46 that assist the annealing element 42 to penetrate and reach the devices of the integrated circuits. These diffusion pathways 46 may be open channels that are arranged to extend through the BEOL interconnect structure to the devices of the integrated circuit 20.

The placement of the heater 30 inside of the package 14 (i.e., in-package), rather than placement on the functional chip 12 (i.e., on-chip), does not interfere with optimum device layouts and circuit designs for the functional chip 12 and the chip technology used to fabricate the functional chip 12. In addition, the annealing chip 10 may be cheaply fabricated with older and less expensive technology than the newer and more expensive technology used to fabricate the functional chip 12.

In use, the annealing chip 10 and the functional chip 12 are placed inside of the package 14 to define the assembly 16, and the assembly 16 is mounted to the substrate 24. The substrate 24 is incorporated into an end product and is operated under normal applied biases in the end product. The biases apply stress on the devices, such as field-effect transistor 70 (FIG. 1A), of the integrated circuit 20, which leads over time to shifts in electrical parameters and adverse changes in performance.

At some point in time after the end product is placed into use, a decision is made to perform an annealing procedure to recover the initial electrical parameters of the devices of the integrated circuit 20 on the functional chip 12. To perform an annealing procedure, the power supply 32 is activated to deliver power to the heater 30 to cause the devices of the integrated circuit 20 to reach a desired annealing temperature or sequence of annealing temperatures. The annealing procedure can be either manually or automatically triggered. In one embodiment, the decision may be based upon observations, such as sensing or detecting degradation of the electrical parameters of the devices of the integrated circuit 20. In another embodiment, an annealing procedure may be automatically scheduled to occur at intervals, such as periodic intervals, during the useful lifetime of the functional chip 12.

The annealing element 42 may evolve or be released from the annealing element source 40 at the annealing chip 10 in coordination with the powering of the heater 30. For example, the release of the annealing element 42 from the annealing element source 40 may result from the temperature increase at the annealing chip 10 when the heater 30 is powered. The annealing element 42 flows in pathway 44 inside the package 14 to reach the functional chip 12 and, in particular, to reach the frontside 12b of the functional chip 12 bearing the integrated circuit 20. The annealing element 42 may participate in the recovery of the initial electrical parameters for the devices of the integrated circuit 20 on the functional chip 12. The annealing procedure proceeds under conditions with no voltage applied to the integrated circuits so that the constituent devices are unbiased. The annealing efficiency may be improved, in comparison with thermal heating alone, because the annealing element 42 may furnish an interface passivating species (e.g., hydrogen). Passivation may reduce interface charge and leakage current.

The annealing temperature at the devices of the integrated circuit 20 of the functional chip 12 should be less than a temperature that would damage the devices or other components of the chip 12. For example, the maximum temperature may be on the order of 200° C. or 250° C. The annealing procedure is effective to extend the useful lifetime of the integrated circuits and their devices on the functional chip 12. The annealing procedure may be performed multiple times to recover the initial electrical parameters of the devices so that the useful lifetime of the functional chip 12 can be further extended in duration.

In one embodiment, the functional chip 12 may be a complementary metal oxide semiconductor (CMOS) product that includes CMOS field-effect transistors in a logic integrated circuit. As best shown in FIG. 1A, the integrated circuit 20 of the functional chip 12 may be comprised of a large number of devices, such as a CMOS field-effect transistor 70.

The field-effect transistor 70 includes a gate electrode 72, a gate dielectric 74, a source 76, and drain 78. The source 76 and drain 78 are defined as doped regions in a device layer 80 comprised of a semiconductor material. The gate electrode 72 and a channel 82 beneath the gate electrode 72 are disposed in the device layer 80 laterally between the source 76 and drain 78. The annealing procedure may passivate traps that are located at the interfaces between the gate dielectric 74 and device layer 80, and traps that are located inside the gate dielectric 74.

Figure 2:
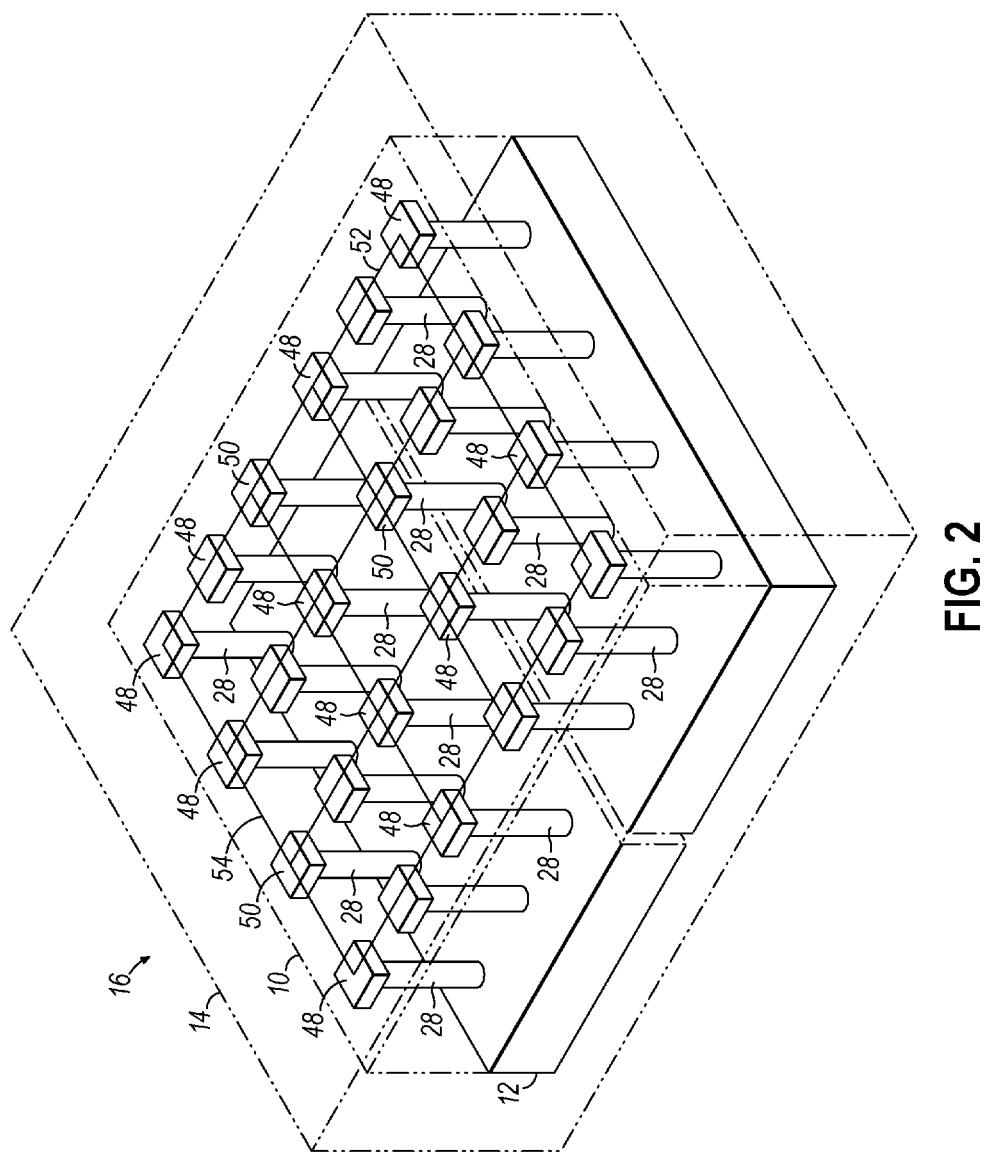
FIGS. 2-5 are diagrammatic views similar to FIG. 1 in accordance with alternative embodiments of the invention.

With reference to FIG. 2 in which like reference numerals refer to like features in FIG. 1 and in accordance with an alternative embodiment, the thermal conductors 28 may be arranged in a pattern, such as a grid, and associated on the annealing chip 10 with a plurality of heating elements 48 comprising the heater 30 and a plurality of temperature sensing elements 50. The heating elements 48 and the temperature sensing elements 50 may be arranged according to the grid of thermal conductors 28. Each heating element 48 is thermally coupled with one or more of the thermal conductors 28 for heat transfer to the functional chip 12. Each temperature sensing element 50 is coupled with one or more of the thermal conductors 28 for detecting a temperature at a location on the functional chip 12. In an alternative embodiment, the temperature sensing elements 50 may be positioned on the functional chip 12.

The heating elements 48 and temperature sensing elements 50 may be individually addressable so that the heating elements 48 can be individually activated and the temperature sensing elements 50 can be individually read. To that end, the heating elements 48 and temperature sensing elements 50 may be coupled with a grid comprising row conductors 52 and column conductors 54. In one embodiment, the heating elements 48 and the temperature sensing elements 50 are each arranged in an array matching an array arrangement for the row conductors 52 and column conductors 54. The intersections of the row conductors 52 and column conductors 54 define addressable locations in the grid so that each heating element 48 can be individually addressed and powered to locally generate heat energy. Although depicted as a single grid, the grid may include multiple grids, such as a grid coupling the power supply 32 with the heating elements 48 and a separate grid coupling the circuitry 26 with the temperature sensing elements 50. The circuitry 26 on the substrate 24 may be coupled with the row conductors 52 and column conductors 54 by lines 22. The circuitry 26 on the substrate 24 may include the logic for controlling the power supplied to the heating elements 48 and for acquiring temperature readings from the temperature sensing elements 50. Alternatively, the control logic may be located on the functional chip 12 and control signals communicated over TSVs from the functional chip 12 to the annealing chip 10.

During an annealing procedure, each heating element 48 may be powered off or powered on, and different currents may be provided to each heating element 48 so that the generation of heat energy can be varied across the annealing chip 10. As a result of the latter functionality, the annealing temperature at the functional chip 12 may be varied across the functional chip 12 so that different zones of the functional chip 12 are heated to different annealing temperatures. The readings from the temperature sensing elements 50 can be used in feedback control of the power supplied to the heating elements 48. In one embodiment, different groups of the heating elements 48 may be powered and unpowered during an annealing procedure so that different regions of the functional chip 12 can be thermally annealed with the exposure to the annealing element at different points in time.

Figure 3:
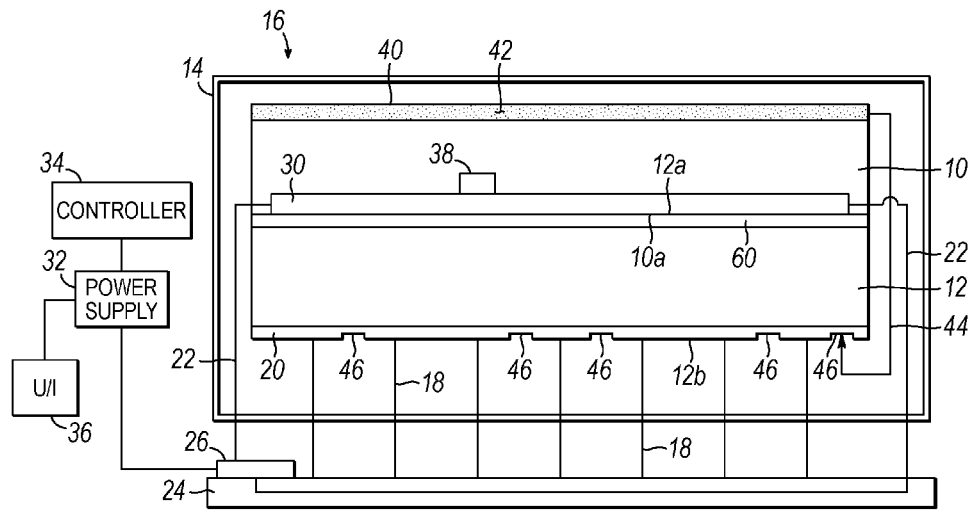

With reference to FIG. 3 in which like reference numerals refer to like features in FIG. 1 and in accordance with an alternative embodiment, the annealing chip 10 and functional chip 12 may be joined by a thermally-conductive layer 60, such as a thermally-conductive tape, film, paste, adhesive, etc. The thermally-conductive layer 60 may function to distribute the heat energy to the functional chip 12 as a replacement for the thermal conductors 28. In an alternative embodiment, the thermally-conductive layer 60 and thermal conductors 28 may be used in combination to distribute the heat energy to the functional chip 12.

Figure 4:
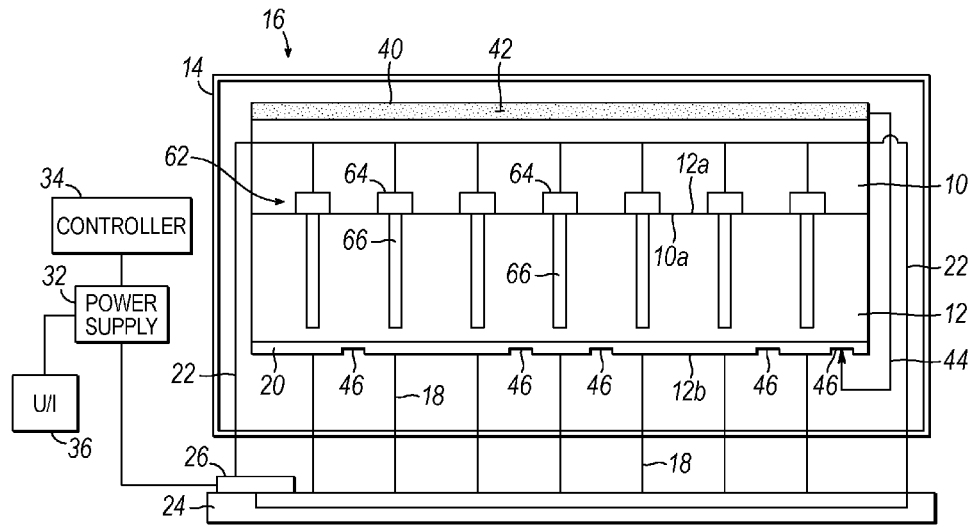

With reference to FIG. 4 in which like reference numerals refer to like features in FIG. 1 and in accordance with an alternative embodiment, the annealing chip 10 may be provided with a light source 62 that may include one or more lighting elements 64. Each lighting element 64 of the light source 62 is capable of light emission in the same package 14 as the functional chip 12. In one embodiment, the annealing chip 10 and light source 62 may comprised a light emitting diode (LED) chip. In one embodiment, each of the lighting elements 64 may be a light emitting diode. The electromagnetic radiation may comprise energetic photons of light with a wavelength in the ultraviolet portion of the electromagnetic spectrum.

The functional chip 12 may be provided with light penetration paths 66 extending into the functional chip 12 from its backside 12a. The light penetration paths 66 may comprise material of the functional chip 12 that is capable of transmitting the electromagnetic energy to the integrated circuits with low loss, or pathways devoid of solid matter that are formed in the material of the functional chip 12. Alternatively, the light penetration paths 66 may comprise areas of the back-end-of-line interconnect structure on the frontside 12b of the functional chip 12 that are free of metal wiring that would reflect or absorb the electromagnetic radiation. The light penetration paths 66 couple the light source 62 with the functional chip 12 so that the electromagnetic radiation can be efficiently transferred to anneal the integrated circuit 20.

The light source 62 may be coupled with the circuitry 26 located on the substrate 24. The circuitry 26 is configured to deliver electrical power to the light source 62 in response to instructions or programmed settings, or instructions or programmed settings received from the integrated circuit 20 of the functional chip 12, and/or other instructions or input. Among the parameters that may be selected with instructions or programmed settings at the circuitry 26 include, but are not limited to, intensity, anneal duration, and anneal frequency. The annealing procedure using the light source 62 may be assisted by providing the annealing element, as discussed above, from the annealing element source 40.

Figure 5:
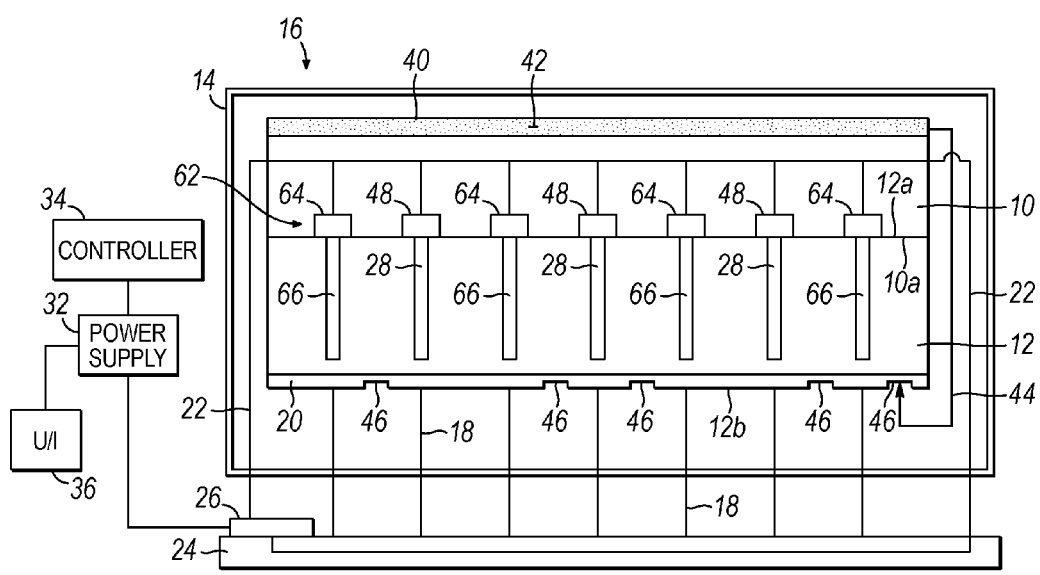

With reference to FIG. 5 in which like reference numerals refer to like features in FIG. 1 and in accordance with an alternative embodiment, the annealing chip 10 may be provided with both the lighting elements 64 of the light source 62 and the heating elements 48 of the heater 30 so that the integrated circuit 20 of the functional chip 12 can be simultaneously annealed with both electromagnetic radiation and heat energy. Thermal conductors 28 may couple the heating elements 48 with the functional chip 12 and light penetration paths 66 may couple the light source 62 with the functional chip 12. The exposure to electromagnetic radiation in combination with heating by heat transfer may enhance the annealing efficiency in comparison with heating by transferred heat energy alone. The annealing procedure using the lighting elements 64 of light source 62 and heating elements 48 of heater 30 may be further assisted by providing the annealing element, as discussed above, from the annealing element source 40.

A feature may be "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for packaging a functional chip including an integrated circuit, the method comprising:
    forming, on an annealing chip, an annealing element source comprised of hydrogen as an annealing element or a light source configured to emit electromagnetic radiation, wherein the light source is formed on the annealing chip;
    forming a heater on the annealing chip;
    coupling the annealing chip with the functional chip for delivery of the electromagnetic energy from the light source to the integrated circuit of the functional chip; and
    placing the annealing chip and the functional chip inside of a package to form an assembly.

2. The method of claim 1 further comprising:
    coupling the heater with the functional chip using a plurality of thermal conductors extending through the functional chip or through the annealing chip.

3. The method of claim 1 further comprising:
    forming a plurality of heating elements on the annealing chip to comprise the heater; and
    coupling the heating elements with a grid of conductors such that each heating element can be individually powered.

4. The method of claim 1 further comprising:
    forming at least one temperature sensor on the annealing chip or on the functional chip.

5. A method for packaging a functional chip including an integrated circuit, the method comprising:
    forming, on an annealing chip, an annealing element source comprised of hydrogen as an annealing element or a light source configured to emit electromagnetic radiation, wherein the annealing element source is formed on the annealing chip;
    forming a heater on the annealing chip;
    coupling the annealing chip with the functional chip for delivery of the annealing element inside the package from the annealing element source to the integrated circuit of the functional chip; and
    placing the annealing chip and the functional chip inside of a package to form an assembly.

6. A method for annealing a functional chip, the method comprising:

delivering, to an integrated circuit of the functional chip, an annealing element or electromagnetic radiation from an annealing chip assembled inside a package with the functional chip, wherein the annealing element or the electromagnetic radiation is delivered to the integrated circuit of the functional chip while the functional chip is in an end product and the integrated circuit of the functional chip is unpowered.

7. The method of claim 6 wherein the annealing element is delivered to the integrated circuit of the functional chip.

8. The method of claim 7 further comprising:

while delivering the annealing element to the functional chip, delivering heat energy from a heater on the annealing chip to the integrated circuit of the functional chip.

9. The method of claim 6 wherein the electromagnetic radiation is delivered to the integrated circuit of the functional chip.

10. The method of claim 9 further comprising:

while delivering the electromagnetic radiation to the integrated circuit of functional chip, delivering heat energy from a heater on the annealing chip to the integrated circuit of the functional chip.

11. An assembly comprising:

a package;

a functional chip inside the package, the functional chip including an integrated circuit;

an annealing chip inside the package, the annealing chip including a heater configured to generate heat energy, and the annealing chip further including an annealing element source comprised of hydrogen as an annealing element or a light source configured to emit electromagnetic radiation; and a plurality of thermal conductors thermally coupling the heater with the functional chip, the thermal conductors extending through the functional chip or extending through the annealing chip.

12. The assembly of claim 11 further comprising:

a thermally-conductive layer between the functional chip and the annealing chip.

13. The assembly of claim 11 wherein the heater includes a plurality of heating elements, and further comprising:

a grid of conductors coupling each heating element with a power supply.

14. The assembly of claim 11 further comprising:

at least one at least one temperature sensor on the annealing chip or on the functional chip.

15. The assembly of claim 11 wherein the functional chip includes a plurality of pathways for delivering the annealing element or the electromagnetic radiation to the integrated circuit.

16. The method of claim 6 wherein the annealing element is hydrogen.

17. The method of claim 5 further comprising:

coupling the heater with the functional chip using a plurality of thermal conductors extending through the functional chip or through the annealing chip.

18. The method of claim 5 further comprising:

forming a plurality of heating elements on the annealing chip to comprise the heater; and coupling the heating elements with a grid of conductors such that each heating element can be individually powered.

19. The method of claim 5 further comprising:

forming at least one temperature sensor on the annealing chip or on the functional chip.

\* \* \* \* \*